(12) United States Patent
Petry et al.

(10) Patent No.: US 8,801,968 B2
(45) Date of Patent: Aug. 12, 2014

(54) SURFACE-MODIFIED CONVERSION PHOSPHORS

(75) Inventors: Ralf Petry, Griesheim (DE); Reinhold Rueger, Roedermark (DE); Tim Vosgroene, Ober-Ramstadt (DE); Holger Winkler, Darmstadt (DE)

(73) Assignee: Merck Patent GmbH, Darmstadt (DE)

( * ) Notice: Subject to any disclaimer, the term of this patent is extended or adjusted under 35 U.S.C. 154(b) by 787 days.

(21) Appl. No.: 12/743,476

(22) PCT Filed: Oct. 29, 2008

(86) PCT No.: PCT/EP2008/009142
§ 371 (c)(1),
(2), (4) Date: Dec. 22, 2010

(87) PCT Pub. No.: WO2010/060437
PCT Pub. Date: Jun. 3, 2010

(65) Prior Publication Data
US 2011/0090683 A1   Apr. 21, 2011

(30) Foreign Application Priority Data
Nov. 22, 2007   (DE) .................. 10 2007 056 342

(51) Int. Cl.
  *C09K 11/02*   (2006.01)
  *H01L 33/00*   (2010.01)
  *C09K 11/77*   (2006.01)
  *C09K 11/08*   (2006.01)
  *H01L 33/50*   (2010.01)

(52) U.S. Cl.
  CPC ......... *C09K 11/0883* (2013.01); *C09K 11/7734* (2013.01); *H01L 2933/0041* (2013.01); *C09K 11/7774* (2013.01); *C09K 11/7721* (2013.01); *H01L 33/502* (2013.01)

USPC ......... 252/301.36; 252/301.4 R; 252/301.4 F; 252/301.5; 313/502

(58) Field of Classification Search
  USPC ............. 428/403, 690; 252/301.4 R–301.6 P, 252/301.36
  See application file for complete search history.

(56) References Cited

U.S. PATENT DOCUMENTS 4,781,647 A * 11/1988 Doane, Jr. ..................... 446/219
4,921,727 A *  5/1990 Datta et al. .................... 427/601

(Continued)

FOREIGN PATENT DOCUMENTS

JP   2-283789   11/1990
JP   8-53667    2/1996

(Continued)

OTHER PUBLICATIONS

Translation for JP 2005-330490, Dec. 2, 2005.*

(Continued)

*Primary Examiner* — Carol M Koslow
(74) *Attorney, Agent, or Firm* — Millen, White, Zelano & Branigan, P.C.

(57) ABSTRACT

The invention relates to surface-modified phosphor particles based on luminescent particles which comprise at least one luminescent compound, where $(Ca,Sr,Ba)_2SiO_4$ and other silicates having one or more activator ions, such as Eu, Ce and Mn, are excluded as luminescent compounds, and where at least one inorganic layer comprising oxides/hydroxides of Si, Al, Zr, Zn, Ti and/or mixtures thereof and an organic coating of organosilanes or polyorganosiloxanes (silicones) and/or mixtures thereof are applied to the luminescent particles, and to a production process.

22 Claims, 2 Drawing Sheets

(56) References Cited

U.S. PATENT DOCUMENTS

| | | | |
|---|---|---|---|
| 6,084,250 A * | 7/2000 | Justel et al. | 257/89 |
| 6,177,030 B1 * | 1/2001 | Shoji et al. | 252/301.4 H |
| 6,603,129 B2 | 8/2003 | Kawabata et al. | |
| 8,021,576 B2 * | 9/2011 | Shimizu et al. | 252/301.4 R |
| 8,125,139 B2 * | 2/2012 | Emoto et al. | 313/503 |
| 2002/0105266 A1 * | 8/2002 | Juestel et al. | 313/512 |
| 2002/0171046 A1 | 11/2002 | Kawabata et al. | |
| 2003/0098644 A1 * | 5/2003 | Thomas | 313/503 |
| 2004/0126615 A1 * | 7/2004 | Mortz et al. | 428/690 |
| 2004/0135121 A1 * | 7/2004 | Toyoda et al. | 252/301.16 |
| 2006/0244712 A1 * | 11/2006 | Cho et al. | 345/102 |
| 2008/0176076 A1 * | 7/2008 | van Veggel et al. | 428/404 |
| 2010/0207139 A1 | 8/2010 | Winkler et al. | |

FOREIGN PATENT DOCUMENTS

| | | | |
|---|---|---|---|
| JP | 09-279137 A | | 10/1997 |
| JP | 2002-356462 | | 12/2002 |
| JP | 2003-31367 | | 1/2003 |
| JP | 2003-183638 | | 7/2003 |
| JP | 2005-330490 | * | 12/2005 |
| JP | 2005-330490 A | | 12/2005 |
| JP | 2007-154066 | | 6/2007 |
| WO | WO 2006/093135 | * | 9/2006 |

OTHER PUBLICATIONS

International Search Report of PCT/EP2008/009142 (Apr. 15, 2010).

P. Schlotter et al., "Fabrication and Characterization of GaN/InGaN/AlGaN Double Heterostructure LEDs and Their Application in Luminescence Conversion LEDs", Materials Science and Engineering, vol. B59, No. 1-3 (1999) pp. 390-394.

English Translation of Japanese Publication 2002-212550, Publication Date: Jul. 31, 2002. Inventor: Kanae Kawabata et al. Assignee: Konica Corp. (Patent Abstracts of Japan).

English Translation of Japanese Publication No: JP 2002-174699. Publication Date: Jun. 21, 2002. Application No: 2000-372739. Filing Date: Dec. 7, 2000. Inventors: Hiroyuki Nabeta. Applicant: Konica Corp. (Machine Translation performed by INPIT (http://www.ipdl.inpit.go.jp).

English Translation of Japanese Publication No: JP 2007-126536. Publication Date: May 24, 2007. Application No: 2005-319711. Filing Date: Nov. 2, 2005. Inventor: Masamichi Harada. Applicant: Sharp Corp. (Machine Translation performed by INPIT (http://www.ipdl.inpit.go.jp).

English Translation of Japanese Patent No: 4214681, Issue Date: Jan. 28, 2009, Publication 2002-212550, Publication Date: Jul. 31, 2002. Application and Priority No: JP200110140A. Filing Date: Jan. 18, 2001. Inventor: Kanae Kawabata et al. Assignee: Konica Corp. (Thomson Innovation).

English Translation of Notification of Reasons for Refusal (2nd Office Action) of Japanese Patent Application No: 2010-540036. Office Action Mail Date: Jan. 7, 2014. (2 pages).

* cited by examiner

SURFACE-MODIFIED CONVERSION PHOSPHORS

The invention relates to surface-modified phosphor particles to which a metal, transition-metal or semimetal oxide coating and subsequently an organic coating are applied, and to a process for the production thereof.

During curing of the resin which contains the LED phosphors, sedimentation of the phosphor particles occurs. As a consequence, an inhomogeneous and unreproducible distribution of the phosphors over the LED chip or in the remote phosphor layer arises. As a result, the LEDs have large differences in light distribution; both the distribution over an LED is highly angle-dependent, and also the light properties are not uniform from LED to LED within a batch. LED manufacturers are therefore forced to carry out complex and costly binning, which results in low yields of saleable LEDs (the target bin with light properties which meet the requirements has a yield of up to approximately 10% of total production. The remaining white LEDs are either destroyed or sold at low prices as "open bin" often under secondary brand names for undemanding applications). This expense becomes clear from the price differences between blue LEDs and white phosphor-containing LEDs, which can be up to 100%. The high initial costs of the white LEDs are in turn hindering rapid replacement of inefficient and short-lifetime incandescent bulbs, halogen lamps and fluorescent lamps by white LEDs.

Functionalisation of phosphors has already been described in the literature. A. *Meijerink et al., Phys. Chem. Chem. Phys.*, 2004, 6, 1633-1636, describe how nanophosphors which have a reactive surface (intrinsic property of nanoparticles which have a large surface area to volume ratio and saturate the high surface energy with bonds of any type) are bonded to tetramethylrhodamine (dye) with glycine as linker in order to observe charge transfer. However, the process described is unsuitable for bonding phosphors to resins and for achieving compatibilisation.

Y. T. Nien et al., *Materials Chemistry and Physics*, 2005, 93, 79-83, disclose how nanophosphors are embedded in HMDS (hexamethyldisilazane) in order to saturate the reactive and unstable surface. In this case, no bonding takes place, but instead merely embedding of the nanophosphor in an $SiO_2$ matrix.

US 2007/0092758 discloses a phosphor paste which consists of a phosphor, a silane-containing dispersant and an organic resin. The phosphor, dispersant and binder are mixed, and the phosphor is dispersed in the binder. The dispersants used consist of a specific hydrophobic organic radical, a hydrophobic group and a silanol anchor group bonded to the hydrophilic group. For homogeneous distribution of the phosphor, it is necessary, despite the added dispersants, to subject the paste to grinding. This can result in impairment of the properties of the phosphor, for example due to the high energy input or due to contamination from the grinding media material.

The object of the present invention consisted firstly in avoiding the above-mentioned disadvantages, such as inhomogeneous and unreproducible distribution of the phosphor particles over the LED chip, and secondly in preparing a phosphor which can be embedded easily in various binder systems.

Surprisingly, it has now been found that this inhomogeneity of light distribution, which is caused by inhomogeneous phosphor layers, is avoided by compatibilisation of the phosphor surface with the silicone or epoxy resin. During the compatibilisation, the surface of the phosphor is provided with functional chemical groups and linkers. These allow the phosphor particles to be matched to the hydrophilic or hydrophobic properties of the resin. This enables the preparation of homogeneous mixtures of resin and phosphor which do not tend to flocculate out.

The present invention thus relates to surface-modified phosphor particles based on luminescent particles which comprise at least one luminescent compound, where $(Ca,Sr,Ba)_2SiO_4$ and other silicates having one or more activator ions, such as Eu, Ce and Mn, codopants based on Fe, Cu and/or Zn or both one or more activator ions and codopants based on Fe, Cu and/or Zn are excluded, and where at least one inorganic layer comprising oxides/hydroxides of Si, Al, Zr, Zn, Ti and/or mixtures thereof and subsequently an organic coating of organosilanes or polyorganosiloxanes (silicones) and/or mixtures thereof are applied to the luminescent particles.

The luminescent particles preferably comprise at least one of the following compounds:
$(Y,Gd,Lu,Sc,Sm,Tb)_3(Al,Ga)_5O_{12}$:Ce (with or without Pr), $YSiO_2N$:Ce, $Y_2Si_3O_3N_4$:Ce, $Gd_2Si_3O_3N_4$:Ce, $BaMgAl_{10}O_{17}$:Eu (with or without Mn), $SrAl_2O_4$:Eu, $Sr_4Al_{14}O_{25}$:Eu, $(Ca,Sr,Ba)Si_2N_2O_2$:Eu, $SrSiAl_2O_3N_2$:Eu, $(Ca,Sr,Ba)_2Si_5N_8$:Eu, $(Ca,Sr,Ba)SiN_2$:Eu, $CaAlSiN_3$:Eu, molybdates, tungstates, vanadates, group III nitrides, group III oxides, in each case individually or mixtures thereof with one or more activator ions, such as Ce, Eu, Mn, Cr, Tb and/or Bi, where the above-mentioned restriction regarding the doped/codoped silicates continues to apply.

The functional groups on the surface of the phosphor form an entanglement and/or crosslinking with or chemical bonding to the components of the resin. In this way, a homogeneous distribution of the phosphor particles can be fixed in the resin. During the resin curing process, no sedimentation of the phosphor particles occurs. In particular in the case of phosphors having high homogeneity of the particle properties (for example morphology, particle-size distribution) prepared by wet-chemical methods, phosphor layers which are advantageous in accordance with the invention can be achieved.

For a white LED provided with the coated phosphors according to the invention, the CCT is homogeneous over the LED over the entire angle range, i.e. the observer perceives the same color temperature ("light color") in any position. By contrast, the white LED provided with conventional phosphors (prepared by mix & fire) has large variance of the CCT, meaning that the observer perceives a different light color in different directions.

During the functionalisation or surface modification, firstly reactive hydroxyl groups are formed on the surface of the phosphor particles by a metal, transition-metal or semimetal oxide by wet-chemical or vapour-deposition (CVD) processes.

The inorganic coating preferably comprises nanoparticles and/or layers of oxides/hydroxides of Si, Al, Zr, Zn, Ti and/or mixtures thereof. A silicon oxide/hydroxide coating is particularly preferred since it has a particularly large number of reactive hydroxyl groups, simplifying further addition of an organic coating.

The inorganic coating of oxides/hydroxides of Al, Zr, Zn, Ti and/or mixtures thereof is preferably substantially transparent, i.e. it must guarantee 90% to 100% transparency both for the excitation spectrum and also for the emission spectrum of the respective conversion phosphors employed. On the other hand, the transparency of the coating according to the invention can also be less than 90% to 100% for all wavelengths which do not correspond to the excitation and emission wavelengths.

The coated phosphor particles are then provided with an organic, preferably substantially transparent coating of organosilanes or polyorganosiloxanes (silicones) and/or mixtures thereof. This coating is also carried out by wet-chemical methods or by a vapour-deposition process. The organosilicon compounds react here with the surface OH groups of the phosphor particles or with the inorganic coating. The chains of the organosilicon compound form a more or less porous layer around the phosphor particles. By modification of the organic chains of the silicon compounds, the desired hydrophobicity of the phosphor particles, the structure of the oligomer/polymer chains and the coupling (physical and/or chemical) to the resin are controlled.

The organosilanes employed are preferably alkoxysilanes.

Examples of organosilanes are propyltrimethoxysilane, propyltriethoxysilane, isobutyltrimethoxysilane, n-octyltrimethoxysilane, i-octyltrimethoxysilane, n-octyltriethoxysilane, n-decyltrimethoxysilane, dodecyltrimethoxysilane, hexadecyltrimethoxysilane, vinyltrimethoxysilane, preferably n-octyl-trimethoxysilane and n-octyltriethoxysilane. Suitable oligomeric, alcohol-free organosilane hydrolysates are, inter alia, the products marketed by Sivento under the trade name "Dynasylan®", such as, for example, Dynasylan HS 2926, Dynasylan HS 2909, Dynasylan HS 2907, Dynasylan HS 2781, Dynasylan HS 2776, Dynasylan HS 2627. In addition, oligomeric vinylsilane and aminosilane hydrolysate are suitable as organic coating. Functionalised organosilanes are, for example, 3-aminopropyltrimethoxy-silane, 3-methacryloxytrimethoxysilane, 3-glycidyloxypropyltrimethoxysilane, beta-(3,4-epoxycyclohexyl)ethyltrimethoxysilane, gamma-iso-cyanatopropyltrimethoxysilane, 1,3-bis(3-glycidoxypropyl)-1,1,3,3-tetra-methyldisiloxane, ureidopropyltriethoxysilane, preferably 3-aminopropyl-trimethoxysilane, 3-methacryloxytrimethoxysilane, 3-glycidyloxypropyl-trimethoxysilane, beta-(3,4-epoxycyclohexyl)ethyltrimethoxysilane, gamma-isocyanatopropyltrimethoxysilane.

Particular preference is given to the use of the following compounds, alone or in mixtures:
Silquest A-186® [beta-(3,4-epoxycyclohexyl)ethyltrimethoxysilane]
Silquest A-1310® gamma-isocyanatopropyltriethoxysilane
Silquest A-1110® gamma-aminopropyltrimethoxysilane
Silquest A-1524® gamma-ureapropyltrimethoxysilane
Silquest A-174® gamma-meth acryloxypropyltrimethoxysilane
Silquest A-151® vinyltriethoxysilane Examples of polymeric silane systems and polyorganosiloxanes are described in WO 98/13426 and are marketed, for example, by Sivento under the trade name Hydrosil®.

The choice of a suitable silane is dependent, inter alia, on whether the silane is to be bonded to an epoxy resin or to a silicone resin. For high-power LEDs (with electrical connected load of min. 1 W), a silicone resin with long-term radiation and temperature stability will be used, whereas for low- or medium-power LEDs (electrical connected load <1 W), as are suitable, for example, for backlighting applications, an epoxy resin with lower temperature and radiation stability will be selected.

The particle size of the phosphors according to the invention is between 1 μm and 40 μm, preferably between 2 μm and 20 μm.

The thickness of the coating according to the invention, consisting of inorganic and organic coatings, is between 5 nm and 200 nm, preferably 10 nm and 50 nm. The particle size of the primary particles of the metal, transition-metal or semimetal oxide coating is between 5 nm and 50 nm. The coating according to the invention is not necessarily homogeneous, but instead may also be in the form of islands or in droplet form on the surface of the particles. The thickness of the organic coating depends on the molecular weight of the organic groups and can be between 0.5 nm and 50 nm, preferably between 1 and 5 nm.

The amount of the organic coating is between 0.02 and 5% by weight, preferably 0.1 to 2% by weight, based on the surface-coated phosphor particles.

The present invention furthermore relates to a process for the production of a surface-modified phosphor particle, characterised by the steps of:
a. production of a phosphor particle by mixing at least two starting materials and at least one dopant and thermal treatment at a temperature T>150° C.,
b. coating of the phosphor particle with an inorganic layer comprising oxides/hydroxides of Al, Zr, Zn, Ti and/or mixtures thereof in a wet-chemical or vapour-deposition process,
c. application of an organic coating of organosilanes or polyorganosiloxanes (silicones) and/or mixtures thereof.

The coating of the phosphor particles is particularly preferably carried out by wet-chemical methods by precipitation of the above-mentioned oxides or hydroxides in aqueous dispersion. To this end, the uncoated phosphor is suspended in water in a reactor and coated with the metal oxide or hydroxide by simultaneous metered addition of at least one metal salt and at least one precipitant with stirring.

As an alternative to metal salts, it is also possible to meter in organometallic compounds, for example metal alkoxides, which then form metal oxides or hydroxides by hydrolytic decomposition. Another possible method of coating the particles is coating via a sol-gel process in an organic solvent, such as, for example, ethanol or methanol. This process is particularly suitable for water-sensitive materials and for acid- or alkali-sensitive substances.

The starting materials for the preparation of the phosphor consist, as mentioned above, of the base material (for example salt solutions of aluminium, yttrium and cerium) and at least one dopant, preferably europium or cerium, and optionally further Gd-, Lu-, Sc-, Sm-, Tb-, Pr- and/or Ga-containing materials. Suitable starting materials are inorganic and/or organic substances, such as nitrates, carbonates, hydrogencarbonates, phosphates, carboxylates, alcoholates, acetates, oxalates, halides, sulfates, organometallic compounds, hydroxides and/or oxides of the metals, semi-metals, transition metals and/or rare-earth metals, which are dissolved and/or suspended in inorganic and/or organic liquids. Preference is given to the use of mixed nitrate solutions, chloride or hydroxide solutions which contain the corresponding elements in the requisite stoichiometric ratio.

Wet-chemical production generally has the advantage over the conventional solid-state diffusion ("mixing and firing") method that the resultant materials have greater uniformity with respect to the stoichiometric composition, the particle size and the morphology of the particles from which the phosphor according to the invention is prepared.

For wet-chemical production of a phosphor particle consisting, for example, of a mixture of yttrium nitrate, aluminium nitrate and cerium nitrate solution, the following known methods are preferred:
coprecipitation with an $NH_4HCO_3$ solution (see, for example, Jander, *Blasius Lehrbuch der analyt. u. präp. anorg. Chem. [Textbook of Analyt. and Prep. Inorg. Chem.]* 2002)

Pecchini method using a solution of citric acid and ethylene glycol (see, for example, *Annual Review of Materials Research* Vol. 36: 2006, 281-331)

combustion method using urea spray-drying of aqueous or organic salt solutions (starting materials)

spray pyrolysis of aqueous or organic salt solutions (starting materials)

In the above-mentioned co-precipitation, which is particularly preferred in accordance with the invention, an $NH_4HCO_3$ solution is added to, for example, chloride or nitrate solutions of the corresponding phosphor starting materials, resulting in the formation of the phosphor precursor.

In the Pecchini method, a precipitation reagent consisting of citric acid and ethylene glycol is added, for example, to the above-mentioned nitrate solutions of the corresponding phosphor starting materials at room temperature, and the mixture is subsequently heated. Increasing the viscosity results in phosphor precursor formation.

In the known combustion method, the above-mentioned nitrate solutions of the corresponding phosphor starting materials are, for example, dissolved in water, then boiled under reflux and treated with urea, resulting in the slow formation of the phosphor precursor.

Spray pyrolysis is one of the aerosol methods, which are characterised by spraying solutions, suspensions or dispersions into a reaction space (reactor) heated in various ways and the formation and deposition of solid particles. In contrast to spray-drying using hot-gas temperatures <200° C., thermal decomposition of the starting materials used (for example salts) and the re-formation of substances (for example oxides, mixed oxides) additionally occur, in addition to evaporation of the solvent, in spray pyrolysis as a high-temperature process.

The 5 method variants mentioned above are described in detail in DE 102006027133.5 (Merck), which is incorporated into the context of the present application in its full scope by way of reference.

The surface-modified phosphor particles according to the invention can be produced by various wet-chemical methods by 1) homogeneously precipitating the constituents, then separating off the solvent, followed by a single- or multistep thermal aftertreatment, where one of these steps may be carried out in a reducing atmosphere,
2) finely dividing the mixture, for example with the aid of a spray process, and removing the solvent, followed by a single- or multistep thermal aftertreatment, where one of these steps may be carried out in a reducing atmosphere, or
3) finely dividing the mixture, for example with the aid of a spray process, and removing the solvent in association with pyrolysis, followed by a single- or multistep thermal aftertreatment, where one of these steps may be carried out in a reducing atmosphere,
4) subsequently coating the phosphors prepared with the aid of methods 1-3 by wet-chemical methods.

The wet-chemical preparation of the phosphor is preferably carried out by the precipitation and/or sol-gel method.

In the above-mentioned thermal aftertreatment, it is preferred for the calcination to be carried out at least partly under reducing conditions (for example using carbon monoxide, forming gas, pure hydrogen, mixtures of hydrogen with an inert gas or at least a vacuum or oxygen-deficient atmosphere).

In general, it is also possible to prepare the uncoated phosphors according to the invention by the solid-state diffusion method, but this causes the disadvantages already mentioned.

In a further embodiment, it may also be advantageous in accordance with the invention for the coating with an inorganic oxide to be omitted and for the phosphor particles to be provided only with an organic coating.

The above-mentioned processes enable any desired outer shapes of the phosphor particles to be produced, such as spherical particles, flakes or structured materials and ceramics.

In addition, the phosphors according to the invention can be excited over a broad range which extends from about 250 nm to 560 nm, preferably 380 nm to about 500 nm. These phosphors are thus suitable for excitation by UV- or blue-emitting primary light sources, such as LEDs or conventional discharge lamps (for example based on Hg).

The present invention furthermore relates to an illumination unit having at least one primary light source whose emission maximum is in the range 250 nm to 530 nm, preferably 380 nm to about 500 nm, where some or all of the primary radiation is converted into longer-wavelength radiation by the surface-modified phosphors according to the invention. This illumination unit preferably emits white light or emits light having a certain colour point (colour-on-demand principle).

The present invention further relates the use of at least one surface-modified phosphor particle as conversion phosphor for conversion of primary radiation into a certain color point in accordance with the color-on-demand concept, wherein the at least one surface-modified phosphor particle is (are) based on luminescent particles which comprise at least one luminescent compound, where $(Ca,Sr,Ba)2SiO4$ and other silicates having one or more activator ions, such as Eu, Ce and Mn, and/or codopants based on Fe, Cu and/or Zn are excluded as luminescent compounds, characterized in that at least one inorganic layer comprising oxides/hydroxides of Si, Al, Zr, Zn, Ti and/or mixtures thereof and an organic coating of organosilanes or polyorgano-siloxanes (silicones) and/or mixtures thereof are applied to the luminescent particles.

In a preferred embodiment of the illumination unit according to the invention, the light source is a luminescent indium aluminium gallium nitride, in particular of the formula $In_iGa_jAl_kN$, where $0 \leq i$, $0 \leq j$, $0 \leq k$, and $i+j+k=1$. Possible forms of light sources of this type are known to the person skilled in the art. They can be light-emitting LED chips having various structures.

In a further preferred embodiment of the illumination unit according to the invention, the light source is a luminescent arrangement based on ZnO, TCO (transparent conducting oxide), ZnSe or SiC or an arrangement based on an organic light-emitting layer (OLED).

In a further preferred embodiment of the illumination unit according to the invention, the light source is a source which exhibits electroluminescence and/or photoluminescence. The light source may furthermore also be a plasma or discharge source.

The phosphors according to the invention can either be dispersed in a resin (for example epoxy or silicone resin), arranged directly on the primary light source or, depending on the application, arranged remote therefrom (the latter arrangement also includes "remote phosphor technology"). The advantages of remote phosphor technology are known to the person skilled in the art and are revealed, for example, in the following publication: Japanese Journ. of Appl. Phys. Vol, 44, No. 21 (2005), L649-L651.

In a further embodiment, it is preferred for the optical coupling of the illumination unit between the coated phosphor and the primary light source to be achieved by means of a light-conducting arrangement. This enables the primary light source to be installed at a central location and to be optically coupled to the phosphor by means of light-conducting devices, such as, for example, light-conducting fibres. In this way, lamps matched to the illumination wishes and merely consisting of one or different phosphors, which may be arranged to form a light screen, and a light conductor, which is coupled to the primary light source, can be achieved. In this way, it is possible to position a strong primary light source at a location which is favourable for the electrical installation and to install lamps comprising phosphors which are coupled to the light conductors at any desired locations without further electrical cabling, but instead only by laying light conductors.

The present invention furthermore relates to the use of the phosphors according to the invention for partial or complete conversion of the blue or near-UV emission from a luminescent diode.

The present invention furthermore relates to the use of the phosphors according to the invention in electroluminescent materials, such as, for example, electroluminescent films (also known as lighting films or light films), in which, for example, zinc sulfide or zinc sulfide doped with $Mn^{2+}$, $Cu^+$ or $Ag^+$ is employed as emitter, which emit in the yellow-green region. The areas of application of the electroluminescent film are, for example, advertising, display backlighting in liquid-crystal display screens (LC displays) and thin-film transistor (TFT) displays, self-illuminating vehicle licence plates, floor graphics (in combination with a crush-resistant and slip-proof laminate), in display and/or control elements, for example in automobiles, trains, ships and aircraft, or also domestic appliances, garden equipment, measuring instruments or sport and leisure equipment.

The following examples are intended to illustrate the present invention. However, they should in no way be regarded as limiting. All compounds or components which can be used in the compositions are either known and commercially available or can be synthesised by known methods. The temperatures indicated in the examples are always given in ° C. It furthermore goes without saying that, both in the description and also in the examples, the added amounts of the components in the compositions always add up to a total of 100%. Percentage data given should always be regarded in the given connection. However, they usually always relate to the weight of the part-amount or total amount indicated.

EXAMPLES

Working Example 1

Coating of a YAG:Ce Phosphor Powder with $SiO_2$ (Generation of Actin Hydroxyl Groups)

50 g of a YAG:Ce phosphor are suspended in 1 liter of ethanol in a 2 l reactor with ground-glass lid, heating mantle and reflux condenser. A solution of 17 g of ammonia water (25% by weight of $NH_3$) in 170 g of water is added. A solution of 48 g of tetraethyl orthosilicate (TEOS) in 48 g of anhydrous ethanol is slowly added dropwise (about 1 ml/min) at 65° C. with stirring. When the addition is complete, the suspension is stirred for a further 2 hours, brought to room temperature and filtered. The residue is washed with ethanol and dried.

Working Example 2

Coating of a YAG:Ce Phosphor with $Al_2O_3$ 50 g of YAG:Ce phosphor are suspended in 950 g of deionised water in a glass reactor with heating mantle. 600 g of an aqueous solution which comprises 98.7 g of $AlCl_3*6H_2O$ per kg of solution are metered into the suspension at 80° C. with stirring over the course of 2½ hours. During this addition, the pH is kept constant at 6.5 by metered addition of sodium hydroxide solution. When the metered addition is complete, the mixture is stirred at 80° C. for a further 1 hour, then cooled to room temperature, and the phosphor is filtered off, washed with water and dried.

Working Example 3

Coating of a Nitride Phosphor Powder with $SiO_2$ 50 g of $Sr_{0.5}Ba_{0.5}SiN_2$:Eu are suspended in 1 liter of ethanol in a 2 l reactor with ground-glass lid, heating mantle and reflux condenser. A solution of 17 g of ammonia water (25% by weight of $NH_3$) in 170 g of water is added. A solution of 35 g of tetraethyl orthosilicate (TEOS) in 35 g of anhydrous ethanol is slowly added dropwise (about 1 ml/min) at 65° C. with stirring. When the addition is complete, the suspension is stirred for a further 2 hours, brought to room temperature and filtered. The residue is washed with ethanol and dried.

Working Example 4

Coating of a Nitride Phosphor Powder with $Al_2O_3$ 50 g of $(Ca_{0.5}Sr_{0.5})_2Si_5N_8$:Eu are suspended in 950 g of deionised water in a glass reactor with heating mantle. 600 g of an aqueous solution which comprises 76.7 g of $AlCl_3*6H_2O$ per kg of solution are metered into the suspension at 80° C. with stirring over the course of 2½ hours. During this addition, the pH is kept constant at 6.5 by metered addition of sodium hydroxide solution. When the metered addition is complete, the mixture is stirred at 80° C. for a further 1 hour, then cooled to room temperature, and the phosphor is filtered off, washed with water and dried.

Coating of the Phosphor from Examples 1 to 4 with Functional Groups

Working Example 5a

Silanes for Epoxy Polymers (Hydrophilic Variant, GE Silanes, Epoxysilane; Suitable for Epoxy Resins)

100 g of a phosphor coated with $SiO_2$ and/or $Al_2O_3$ and described in the above examples are suspended in 1350 ml of deionised water with vigorous stirring. The pH of the suspension is adjusted to pH=6.5 using 5% by weight $H_2SO_4$, and the suspension is heated to 75° C. 4.0 g of a 1:1 mixture of Silquest A-186® [beta-(3,4-epoxycyclohexyl)ethyltrimethoxysilane] and Silquest A-1310® [gamma-isocyanatopropyltriethoxysilane] are subsequently metered into the suspension over the course of 60 min with moderate stirring. When the addition is complete, the mixture is subsequently stirred for 15 min in order to complete the coupling of the silanes to the surface. The pH is corrected to 6.5 by means of 5% by weight $H_2SO_4$.

The suspension is subsequently filtered and washed with deionised water until salt-free. Drying is carried out at 130° C. for 20 h. The phosphor powder obtained in this way is then sieved by means of a 20 µm sieve.

Working Example 5b

Silanes Especially for Silicone-Phosphor Coupling 100 g of a phosphor coated with $SiO_2$ and/or $Al_2O_3$ and described in the above examples are suspended in 1350 ml of deionised water with vigorous stirring. The pH of the suspension is adjusted to pH=6.5 using 5% by weight $H_2SO_4$, and the suspension is heated to 75° C. 6.0 g of a 1:2 mixture of Silquest A-1110® [gamma-aminopropyltrimethoxysilane] and Silquest A-1524® [gamma-ureapropyltrimethoxysilane] are subsequently metered into the suspension over the course of 75 min with moderate stirring. When the addition is complete, the mixture is subsequently stirred for 15 min in order to complete the coupling of the silanes to the surface. The pH is corrected to 6.5 by means of 5% by weight $H_2SO_4$.

The suspension is subsequently filtered and washed with deionised water until salt-free. Drying is carried out at 140° C. for 20 h. The phosphor powder obtained in this way is then sieved by means of a 20 μm sieve.

Working Example 5c

Vinylsilane for Silicone-Phosphor Coupling 100 g of a phosphor coated with $SiO_2$ and/or $Al_2O_3$ and described in the above examples are suspended in 1350 ml of deionised water with vigorous stirring. The pH of the suspension is adjusted to pH=6.8 using 5% by weight $H_2SO_4$, and the suspension is heated to 75° C. 6.0 g of a 1:2 mixture of Silquest A-174® [gamma-methacryloxypropyltrimethoxysilane] and Silquest A-151® [vinyltriethoxysilane] are subsequently metered into the suspension over the course of 90 min with moderate stirring. When the addition is complete, the mixture is subsequently stirred for 15 min in order to complete the coupling of the silanes to the surface. The pH is corrected to 6.5 by means of 5% by weight $H_2SO_4$.

The suspension is subsequently filtered and washed with deionised water until salt-free. Drying is carried out at 140° C. for 20 h. The phosphor powder obtained in this way is then sieved by means of a 20 μm sieve.

Working Example 6

Production of an LED

The following mixtures are prepared in a Speedmixer® (speed 3000 rpm, time duration: 5 min, room temperature):

50 ml of the two resin components JCR 6122 a and b are in each case mixed with 8% by weight of the phosphor powder compatibilised in accordance with Example 3a, b or c and 1.2% of silicic acid powder having an average diameter of 0.5 μm. The two resin mixtures are combined, stirred and degassed. 10 ml are then introduced into the stock tank of a jet dispenser or screw metering valve dispenser. Bonded COB (chip on board) crude LED packages are placed below the dispensing valve. Glob tops comprising the resin mixture are then dripped onto the chips of the crude LED packages by means of the dispenser. These coated LEDs are conditioned at 150° C. for 1 hour in a drying cabinet. The resin cures in the process.

DESCRIPTION OF THE FIGURES

The invention will be explained in greater detail below with reference to a number of illustrative embodiments.

Figure 1:
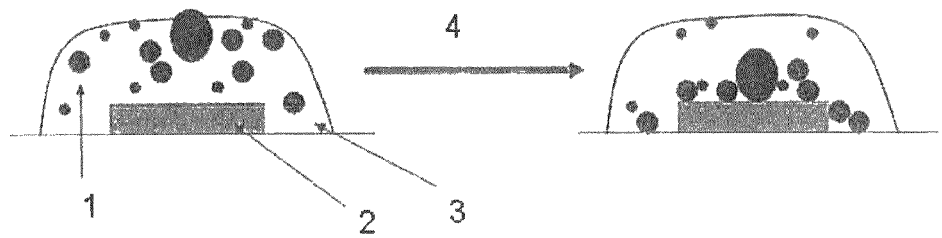
FIG. 1 shows uncoated phosphors (1) incorporated into resin (3) above the LED chip (2). The left-hand diagram represents the state immediately after application of the phosphor/resin mixture to the chip. After curing of the resin (4), the state of the phosphor/resin mixture is as follows (right-hand diagram): the larger phosphor particles exhibit a strong tendency towards sedimentation. The particles consequently distribute themselves inhomogeneously. This distribution is "frozen" after solidification of the resin.
Figure 2:
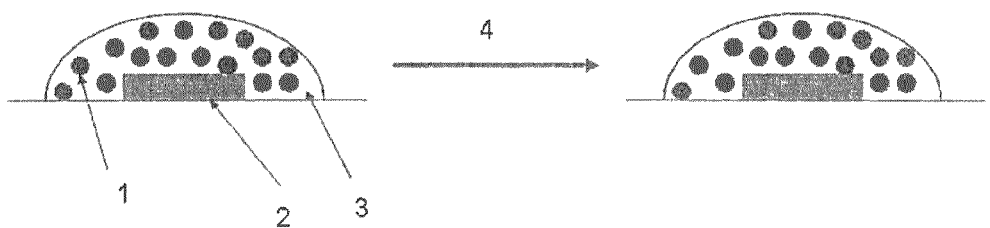
FIG. 2 shows phosphors (1) coated in accordance with the invention incorporated into resin (3) above the LED chip (2). The left-hand figure shows the homogeneous distribution of the uniform phosphor powders. This homogeneity is facilitated by the compatibilisation according to the invention of the phosphor surface with the resin properties. During curing, the distribution is not affected since the phosphors are, in accordance with the invention, crosslinked with or chemically bonded to the resin. In conclusion, the phosphor layer above the LED is uniform (see right-hand figure).
Figure 3:
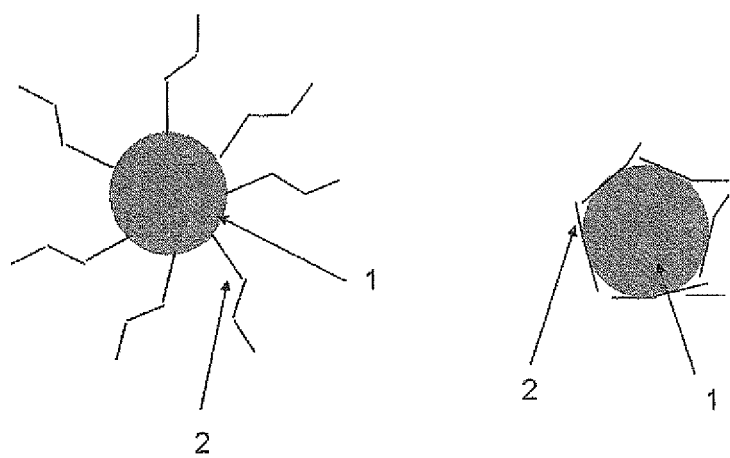
FIG. 3 shows silicone- or silane-coated phosphor particles (1) having two different structures with respect to the polymer chains (2). On the one hand, the surface-bonded polymer chains improve the dispersibility of the phosphor particles in the resin. On the other hand, the polymer chains can act as "spacers" and thus prevent agglomeration of phosphor particles. Furthermore, bonding of the compatiblised phosphor particles to the resin (crosslinking or reaction with constituents of the resin) is achieved.

The invention claimed is:

1. Surface-modified phosphor particles based on luminescent particles comprising:
at least one luminescent compound selected from:
$(Y,Gd,Lu,Sc,Sm,Tb)_3(Al,Ga)_5O_{12}$:Ce with Pr; $(Y,Gd,Lu,Sc,Sm,Tb)_3(Al,Ga)_5O_{12}$:Ce without Pr; $YSiO_2N$:Ce; $Y_2Si_3O_3N_4$:Ce; $Gd_2Si_3O_3N_4$:Ce; $BaMgAl_{10}O_{17}$:Eu with Mn; $BaMgAl_{10}O_{17}$:Eu without Mn; $Sr_4Al_{14}O_{25}$:Eu; $(Ca,Sr,Ba)Si_2N_2O_2$:Eu; $SrSiAl_2O_3N_2$:Eu; $(Ca,Sr,Ba)_2Si_5N_8$:Eu; $(Ca,Sr,Ba)SiN_2$:Eu; $CaAlSiN_3$:Eu; molybdates; tungstates; vanadates; group III nitrides; and group III oxides, in each case individually or mixtures thereof with one or more activator ions,
at least one inorganic layer comprising oxides/hydroxides of Si, Al, Zr, Zn, Ti and/or mixtures thereof, and
an organic coating of organosilanes or polyorganosiloxanes and/or mixtures thereof are applied to the luminescent particles, wherein said at least one inorganic layer is between said at least one luminescent compound and said organic coating,
wherein the amount of the organic coating is between 0.02 and 5% by weight based on the surface-coated phosphor particles.

2. Surface-modified phosphor particles according to claim 1, wherein the particle size of the phosphor particles is between 1 and 40 μm.

3. Surface-modified phosphor particles according to claim 1, wherein the inorganic coating and the organic coating are substantially transparent.

4. Surface-modified phosphor particles according to claim 1, wherein said organic layer is a layer of alkoxysilanes.

5. Surface-modified phosphor particles according to claim 1, wherein said organic layer comprises propyltrimethoxysilane, propyltriethoxysilane, isobutyltrimethoxysilane, n-octyltrimethoxysilane, i-octyltrimethoxysilane, n-octyltriethoxysilane, n-decyltrimethoxysilane, dodecyltrimethoxysilane, hexadecyltrimethoxysilane, vinyltrimethoxysilane, 3-methacryloxytrimethoxysilane, 3-glycidyloxypropyltrimethoxysilane, beta-(3,4-epoxycyclohexyl)ethyltrimethoxysilane, gamma-isocyanatopropyltrimethoxysilane, 1,3-bis(3-glycidoxypropyl)-1,1,3,3-tetramethyldisiloxane, ureidopropyltriethoxysilane, gamma-isocyanatopropyltriethoxysilane, gamma-aminopropyltrimethoxysilane, gamma-ureapropyltrimethoxysilane, gamma-methacryloxypropyltrimethoxysilane, vinyltriethoxysilane, or mixtures thereof.

6. Surface-modified phosphor particles according to claim 1, wherein the thickness of the inorganic and organic coatings is between 5 nm and 200 nm.

7. Surface-modified phosphor particles according to claim 1, wherein the particle size of the primary particles of the inorganic coating is between 5 nm and 50 nm, and the thickness of the organic coating is between 0.5 nm and 50 nm.

8. Surface-modified phosphor particles according to claim 1, wherein said at least one inorganic layer comprises $SiO_2$, $Al_2O_3$ or mixtures thereof.

9. Surface-modified phosphor particles according to claim 8, wherein said organic layer comprises beta-(3,4-epoxycyclohexyl)ethyltrimethoxysilane, gamma-isocyanatopropyltrimethoxysilane, gamma-aminopropyltrimethoxysilane, gamma-ureapropyltrimethoxysilane, gamma-methacryloxypropyltrimethoxysilane, vinyltriethoxysilane, or mixtures thereof.

10. Surface-modified phosphor particles according to claim 1, wherein said organic layer comprises beta-(3,4-epoxycyclohexyl)ethyltrimethoxysilane, gamma-isocyanatopropyltrimethoxysilane, gamma-aminopropyltrimethoxysilane, gamma-ureapropyltrimethoxysilane, gamma-methacryloxypropyltrimethoxysilane, vinyltriethoxysilane, or mixtures thereof.

11. Surface-modified phosphor particles according to claim 1, wherein said luminescent compound is $(Ca_{0.5}Sr_{0.5})_2Si_5N_8$:Eu.

12. Surface-modified phosphor particles according to claim 1, wherein said luminescent compound is selected from: $(Y,Gd,Lu,Sc,Sm,Tb)_3(Al,Ga)_5O_{12}$:Ce with Pr; $YSiO_2N$:Ce; $Y_2Si_3O_3N_4$:Ce; $Gd_2Si_3O_3N_4$:Ce; $BaMgAl_{10}O_{17}$:Eu without Mn; $Sr_4Al_{14}O_{25}$:Eu; $(Ca,Sr,Ba)Si_2N_2O_2$:Eu; $SrSiAl_2O_3N_2$:Eu; $(Ca,Sr,Ba)_2Si_5N_8$:Eu; $(Ca,Sr,Ba)SiN_2$:Eu; $CaAlSiN_3$:Eu; molybdates; tungstates; vanadates; group III nitrides; and group III oxides, in each case individually or mixtures thereof with one or more activator ions.

13. A composition comprising surface-modified phosphor particles according to claim 1 within silicone or epoxy resin.

14. A conversion phosphor for conversion of primary radiation into a certain color point in accordance with the color-on-demand concept, comprising a conversion phosphor of at least one surface-modified phosphor particle according to claim 1.

15. A method for conversion of blue or near-UV emission into visible white radiation, comprising employing at least one surface-modified phosphor particle according to claim 1.

16. An illumination unit having at least one primary light source whose emission maximum is in the range of 250 nm to 530 nm where some or all of this radiation is converted into longer-wavelength radiation by surface-modified phosphor particles according to claim 1.

17. The illumination unit according to claim 16, wherein the light source is a luminescent indium aluminum gallium nitride.

18. The illumination unit according to claim 16, wherein the phosphor is arranged directly on the primary light source.

19. The illumination unit according to claim 16, wherein the optical coupling between the phosphor and the primary light source is achieved by means of a light-conducting arrangement.

20. The illumination unit according to claim 16, wherein the light source is a material based on an organic light-emitting layer.

21. The illumination unit according to claim 16, wherein the light source is a source which exhibits electroluminescence and/or photoluminescence.

22. The illumination unit according to claim 16, wherein the phosphor is arranged remote from the primary light source.

* * * * *